United States Patent
Shimizu

(10) Patent No.: US 6,723,615 B2
(45) Date of Patent: Apr. 20, 2004

(54) SEMICONDUCTOR DEVICE AND METHOD OF FABRICATING THE SAME

(75) Inventor: Shu Shimizu, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/197,870

(22) Filed: Jul. 19, 2002

(65) Prior Publication Data

US 2003/0143815 A1 Jul. 31, 2003

(30) Foreign Application Priority Data

Jan. 31, 2002 (JP) ........................................ 2002-022772

(51) Int. Cl.[7] ............................ H01L 21/76; H01L 29/00
(52) U.S. Cl. ........................ 438/424; 438/425; 438/435; 438/437; 438/444; 438/452; 257/506; 257/510; 257/647
(58) Field of Search ............................... 438/424, 425, 438/435, 437, 444, 452; 257/506, 510, 647

(56) References Cited

U.S. PATENT DOCUMENTS

| | | | | |
|---|---|---|---|---|
| 5,646,063 A | * | 7/1997 | Mehta et al. | 438/425 |
| 5,679,599 A | * | 10/1997 | Mehta | 438/425 |
| 5,721,174 A | * | 2/1998 | Peidous | 438/445 |
| 6,018,180 A | * | 1/2000 | Cheek et al. | 257/344 |
| 6,020,621 A | * | 2/2000 | Wu | 257/506 |
| 6,034,409 A | | 3/2000 | Sakai et al. | |
| 6,040,231 A | * | 3/2000 | Wu | 438/424 |
| 6,060,399 A | * | 5/2000 | Kim et al. | 438/706 |
| 6,165,870 A | * | 12/2000 | Shim et al. | 438/424 |
| 6,207,532 B1 | * | 3/2001 | Lin et al. | 438/424 |
| 6,274,457 B1 | | 8/2001 | Sakai et al. | |
| 6,350,655 B2 | * | 2/2002 | Mizuo | 438/296 |
| 6,350,660 B1 | * | 2/2002 | Yu et al. | 438/424 |
| 6,391,729 B1 | * | 5/2002 | Hui | 438/296 |
| 6,579,777 B1 | * | 6/2003 | Yen et al. | 438/444 |

\* cited by examiner

*Primary Examiner*—Matthew Smith
*Assistant Examiner*—Lex H. Malsawma
(74) *Attorney, Agent, or Firm*—McDermott, Will & Emery

(57) ABSTRACT

A highly reliable semiconductor device capable of preventing generation of a leakage current is provided. The semiconductor device comprises a silicon substrate having a main surface and including a trench formed on the main surface. The trench is defined by surfaces including a bottom surface, a side surface, continuous to the bottom surface, having first inclination with respect to the main surface, and an intermediate surface, formed between the main surface and the bottom surface, having second inclination smaller than the first inclination with respect to the main surface. The semiconductor device further comprises an n-type impurity region.

8 Claims, 11 Drawing Sheets

SEMICONDUCTOR DEVICE AND METHOD OF FABRICATING THE SAME

BACKGROUND OF THE INVENTION

1. Field of the Invention

The present invention relates to a semiconductor device and a method of fabricating the same, and more particularly, it relates to a semiconductor device having a trench for element isolation and a method of fabricating the same.

2. Description of the Prior Art

A semiconductor device employing trench isolation for isolating semiconductor elements formed on a semiconductor substrate from each other is known in general. FIG. 21 is a sectional view of such a conventional semiconductor device. Referring to FIG. 21, a thermal oxide film 102 is formed on a surface of a p-type silicon substrate 101 expressed by the (001) plane. A plurality of n-type impurity regions 121 are formed on the surface of the silicon substrate 101. The n-type impurity regions 121 are isolated from each other by a trench 187 formed on the surface of the silicon substrate 101 and a silicon oxide film 109 filling up the trench 187. Such isolation is referred to as shallow trench isolation (STI). The n-type impurity regions 121 are employed as source/drain regions of a field-effect transistor, for example.

A problem in the conventional semiconductor device is now described. FIG. 22 is a sectional view showing the problem caused in the conventional semiconductor device. Referring to FIG. 22, an interlayer isolation film 120 is generally formed on the silicon substrate 101. A contact hole 120*h* is formed to be connected with one of the n-type impurity region 121. The contact hole 120*h*, formed not to reach the trench 187 in general, may reach the trench 187 due to some cause, as shown in FIG. 22. An n-type impurity is injected into the silicon substrate 101 through the contact hole 120*h*. This injection is referred to as SAC (self-aligned contact) injection. A plug layer 123 is formed to fill up the contact hole 120*h*.

However, the side wall of the trench 187 is so steeply inclined with respect to the silicon substrate 101 that it is difficult to form a homogeneous diffusion layer of the n-type impurity on the side wall of the trench 187 by SAC injection. Therefore, the p-type silicon substrate 101 or a p-type well region formed on the silicon substrate 101 is exposed on the portion of the silicon substrate 101 facing the trench 187. The plug layer 123 electrically connects the n-type impurity region 121 and the p-type silicon substrate 101 with each other. While no current flows from the n-type impurity region 121 to the p-type silicon substrate 101 in general, a current flows from the n-type impurity region 121 to the p-type silicon substrate 101 through the plug layer 123 in the structure shown in FIG. 22, leading to generation of a leakage current. Thus, the semiconductor device is disadvantageously reduced in reliability.

SUMMARY OF THE INVENTION

Accordingly, the present invention has been proposed in order to solve the aforementioned problem, and an object thereof is to provide a semiconductor device having high reliability.

The semiconductor device according to the present invention comprises a semiconductor substrate having a main surface and including a trench formed on the main surface. The trench is defined by surfaces including a bottom surface, a side surface, continuous to the bottom surface, having first inclination with respect to the main surface and an intermediate surface, formed between the main surface and the bottom surface, having second inclination smaller than the first inclination with respect to the main surface. The semiconductor device further comprises an impurity region including a bottom surface having a depth from the main surface larger than the depth from the main surface to the intermediate surface with a surface defined by the intermediate surface.

In the semiconductor device having the aforementioned structure, the trench is defined by the surfaces including the intermediate surface having relatively small inclination. The impurity region includes the bottom surface having the depth larger than the depth from the main surface to the intermediate surface, and the surface of the impurity region is defined by the intermediate surface. When a plug layer comes into contact with the intermediate surface, therefore, the intermediate surface comes into contact with the impurity region, not in contact with a portion of the semiconductor substrate having an opposite conductivity type to the impurity region. Therefore, generation of a leakage current can be prevented for providing a highly reliable semiconductor device. Further, the impurity region is formed up to the portion of the intermediate surface, whereby formation of a depletion layer can be prevented on the portion of the intermediate surface. Consequently, this portion can be prevented from generation of a leakage current.

A method of fabricating a semiconductor device according to the present invention comprises steps of:

(1) forming a first silicon oxide film on a main surface of a semiconductor substrate;

(2) forming a polysilicon layer on the first silicon oxide film;

(3) forming a mask layer including a first opening having a first opening diameter on the polysilicon layer;

(4) selectively removing part of the polysilicon layer, part of the first silicon oxide film and part of the semiconductor substrate along the first opening through the mask layer serving as a mask thereby forming a second opening continuous to the first opening in the polysilicon layer, forming a third opening continuous to the second opening in the first silicon oxide film and forming a first cavity, defined by a side surface and a bottom surface, continuous to the third opening in the semiconductor substrate;

(5) oxidizing the portion of the polysilicon layer defining the second opening and the side and bottom surfaces of the first cavity for forming a second silicon oxide film having a side portion and a bottom portion while forming a second cavity receiving the second silicon oxide film in the semiconductor substrate;

(6) removing the bottom portion of the second silicon oxide film for exposing the bottom surface of the second cavity while leaving the side portion of the second silicon oxide film thereby forming a fourth opening, defined by the side portion, having an opening diameter smaller than the first opening diameter;

(7) selectively removing part of the semiconductor substrate along the fourth opening through the left side portion serving as a mask thereby forming a trench; and (8) oxidizing the surface of the trench.

In the method of fabricating a semiconductor device comprising the aforementioned steps, the trench is formed by forming the second cavity and thereafter partially removing the semiconductor substrate along the fourth opening provided in the second cavity. Therefore, the trench has a portion having a large opening diameter formed by the second cavity and a portion having a small opening diameter formed by selectively partially removing the semiconductor substrate along the fourth opening. Also when a contact hole comes into contact with the portion having a large opening diameter formed by the second cavity, a homogeneous diffusion layer can be formed due to loose inclination of this portion. Consequently, generation of a leakage current can be prevented for providing a highly reliable semiconductor device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

(First Embodiment)

Figure 1:
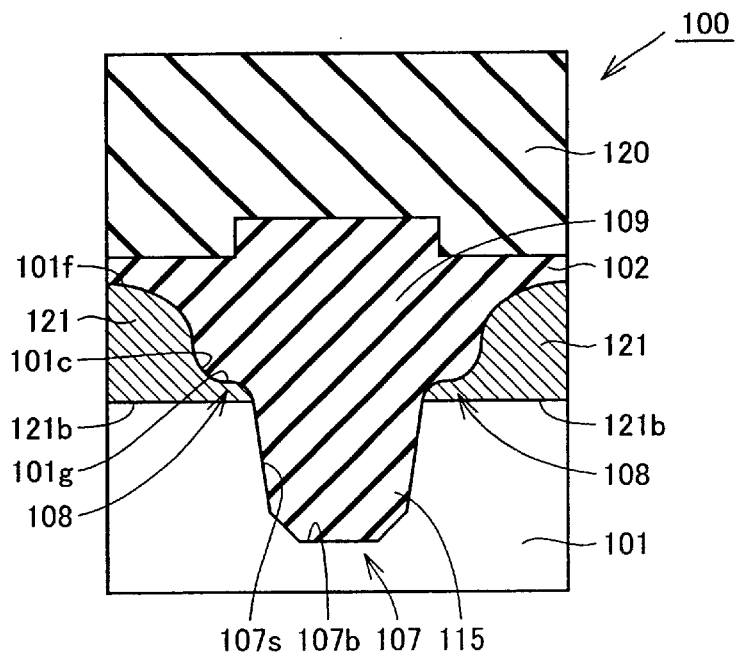
FIG. 1 is a sectional view of a semiconductor device according to a first embodiment of the present invention.

Referring to FIG. 1, a semiconductor device 100 according to a first embodiment of the present invention comprises a silicon substrate 101 having a main surface 101$f$ and including a trench 107 formed in the main surface 101$f$ for serving as a semiconductor substrate. The trench 107 is defined by surfaces including a bottom surface 107$b$, a side surface 107$s$, continuous to the bottom surface 107$b$, having first inclination with respect to the main surface 101$f$ and an intermediate surface 101$c$, formed between the main surface 101$f$ and the bottom surface 107$b$, having second inclination smaller than the first inclination with respect to the main surface 101$f$. The semiconductor device 100 further comprises n-type impurity regions 121 including bottom surfaces 121$b$ having a depth from the main surface 101$f$ larger than the depth from the main surface 101$f$ to the intermediate surface 101$c$ with surfaces defined by the intermediate surface 101$c$.

The intermediate surface 101$c$ has a stepped shape. The bottom surface 107$b$, the intermediate surface 101$c$ and the main surface 101$f$ are stepped. The intermediate surface 101$c$ has a portion 101$g$ substantially parallel to the main surface 101$f$ Portions of the silicon substrate 101 defining the side surface 107$s$ and the bottom surface 107$b$ contain a first conductivity type (p-type) impurity, and the n-type impurity regions 121 contain a second conductivity type (n-type) impurity. The semiconductor device 100 further comprises a silicon oxide film 109 serving as an insulating layer filling up the trench 107.

The semiconductor device 100 includes the p-type silicon substrate 101. A thermal oxide film 102 serving as a gate insulator film is formed on the main surface 10 if expressed by the (001) plane of the silicon substrate 101. The plurality of n-type impurity regions 121 are formed on the surface of the silicon substrate 101 at a distance from each other. The n-type impurity regions 121 are isolated from each other by the trench 107 formed on the main surface 101$f$ of the silicon substrate 101 and the silicon oxide film 109 filling up the trench 107. The n-type impurity regions 121 are employed as source/drain regions of a field-effect transistor, for example.

The trench 107 has a portion having a relatively small opening diameter defined by the side surface 107$s$ and a portion having a large opening diameter defined by a cavity 108. The cavity 108 has a stepped shape. An interlayer isolation film 120 is formed to cover the silicon oxide film 109 and the thermal oxide film 102.

Figure 2:
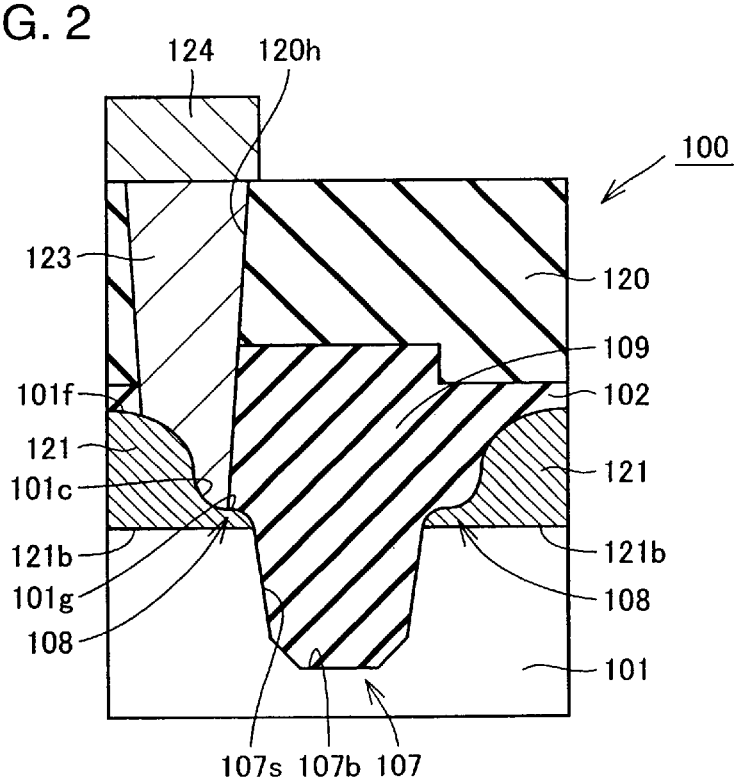
FIG. 2 is a sectional view for illustrating the function of the semiconductor device shown in FIG. 1.

Referring to FIG. 2, a contact hole 120$h$ is formed to be connected to one of the n-type impurity regions 121. The contact hole 120$h$ is formed not to reach the trench 107, i.e., to reach only the main surface 10 if in general. However, the contact hole 120$h$ may reach the intermediate surface 101$c$ of the trench 107 due to some cause, as shown in FIG. 2. An n-type impurity is SAC-injected into the silicon substrate 101 through the contact hole 120$h$. A plug layer 123 is formed to fill up the contact hole 120$h$. A conductive layer 124 is formed on the plug layer 123.

The intermediate surface 101$c$ of the trench 107 is so loosely inclined with respect to the main surface 101$f$ of the silicon substrate 101 that a homogeneous diffusion layer of the n-type impurity can be formed on the intermediate surface 101$c$ by SAC injection. Therefore, the plug layer 123 filling up the contact hole 120$h$ comes into contact with only the n-type impurity region 121, not in contact with the p-type impurity. Therefore, generation of a leakage current can be prevented for providing a highly reliable semiconductor device 100. Further, the n-type impurity region 121 is formed up to the portion of the intermediate surface 101$c$, whereby the intermediate surface 101$c$ can be prevented from formation of a depletion layer. Consequently, generation of a leakage current can be prevented in this portion.

Figure 3:
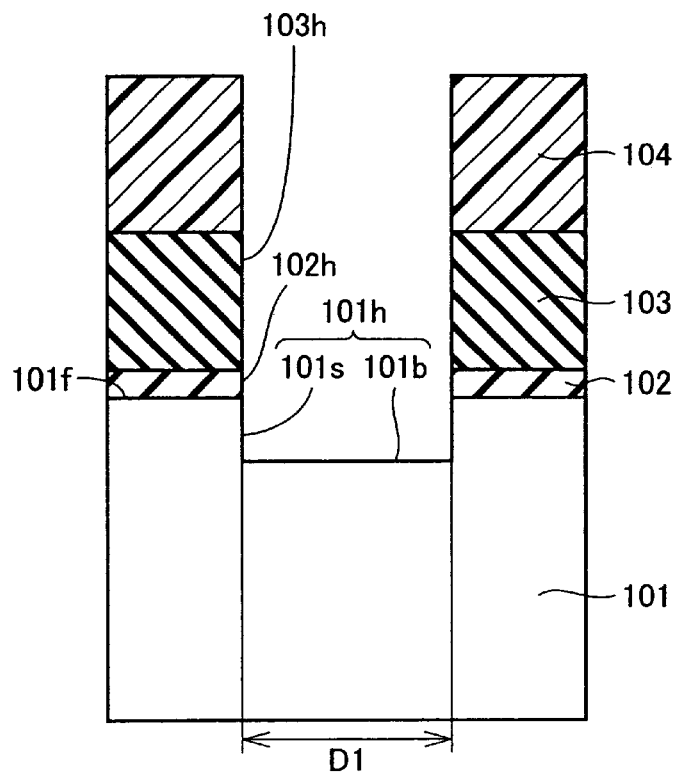
FIGS. 3 to 10 are sectional views showing first to eighth steps of a method of fabricating a semiconductor device according to the first embodiment of the present invention.

Referring to FIG. 3, the thermal oxide film 102 is formed on the surface of the silicon substrate 101 as a first silicon oxide film having a thickness of about 20 nm. A silicon nitride film 103 of about 200 nm in thickness is formed on the thermal oxide film 102. Resist is applied onto the silicon nitride film 103 and patterned thereby forming a resist pattern 104. The resist pattern 104 is employed as a mask for dry-etching the silicon nitride film 103, the thermal oxide film 102 and the silicon substrate 101. Thus, an opening 103$h$ serving as a first opening is formed in the silicon nitride film 103 serving as a mask layer. An opening 102$h$ serving as the first opening is formed in the thermal oxide film 102. A cavity 101$h$, continuous to first to third openings, having a side surface 10 is and a bottom surface 101$b$ is formed in the silicon substrate 101. The cavity 101$h$ has a relatively large opening diameter D1.

Figure 4:
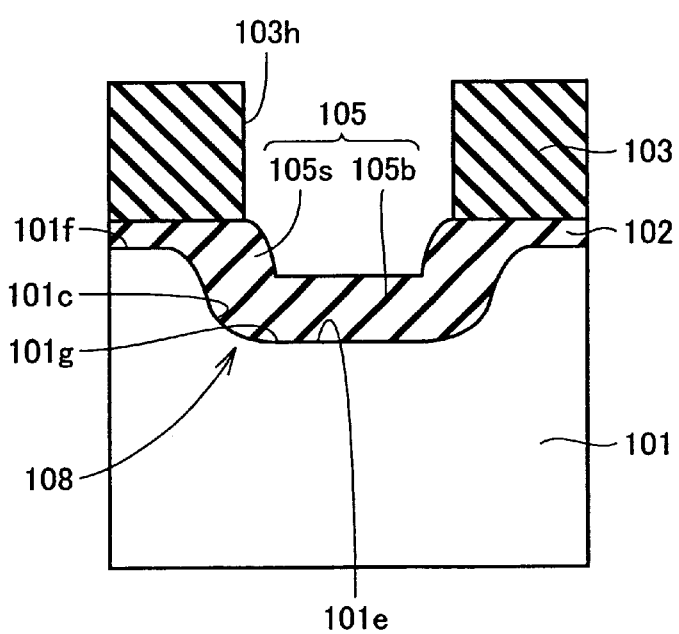

Referring to FIG. 4, the resist pattern 104 is removed. Thereafter a thermal oxide film 105 is formed by thermal oxidation as a second silicon oxide film of about 100 nm in thickness. The thermal oxide film 105, continuous to the portion of the thermal oxide film 102 defining the opening 102h, has a side portion 105s resulting from oxidation of the side surface 101s and a bottom portion 105b resulting from oxidation of the bottom surface 101b. Simultaneously with such formation of the thermal oxide film 105, the cavity 108 is formed in the silicon substrate 101 as a second cavity. The cavity 108 includes the intermediate surface 101c having the portion 101g parallel to the main surface 101f. The surface of the cavity 108 is rounded.

Figure 5:
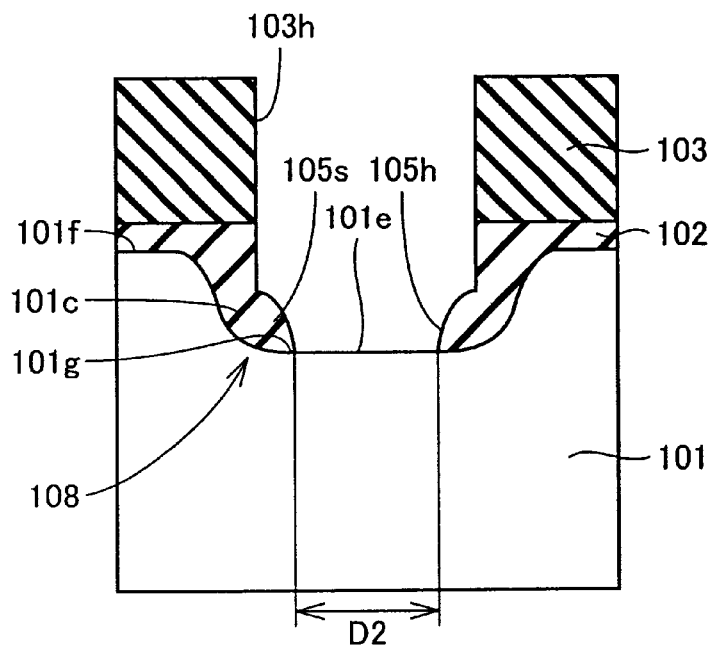

Referring to FIG. 5, the thermal oxide film 105 is dry-etched through the patterned silicon nitride film 103 and the patterned thermal oxide film 102. Thus, the bottom portion 105b of the thermal oxide film 105 is removed while leaving the side portion 105s. At the same time, a surface 101e of the silicon substrate 101 defining the bottom surface of the cavity 108 is exposed. In the left side portion 105c, the thickness of the silicon oxide film is larger than that of the thermal oxide film 102, and this side portion 105s is present as a bird's beak. The side potion 105s defines a fourth opening 105h. The fourth opening 105h has an opening diameter D2 smaller than the first opening diameter D1.

Figure 6:
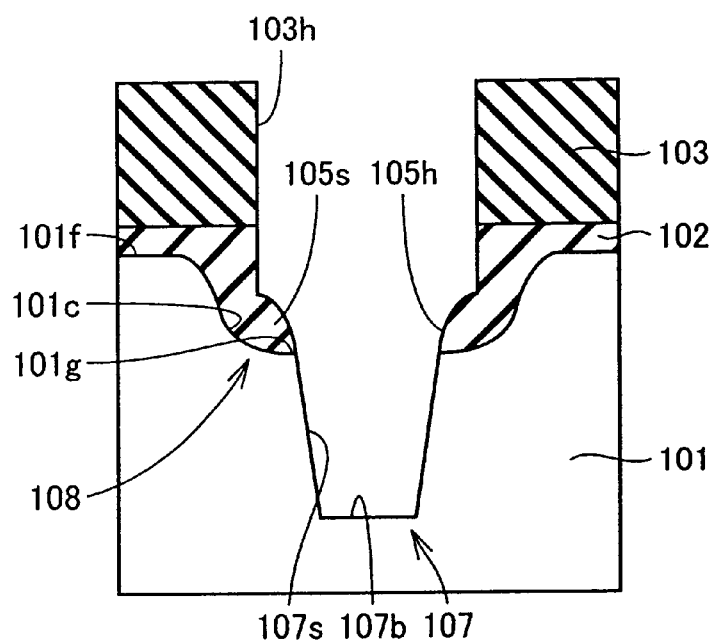

Referring to FIG. 6, the silicon substrate 101 is dry-etched (plasma-etched) thereby partially removing the silicon substrate 101 along the opening 105h and forming the trench 107 of about 300 nm in depth. The trench 107 has the bottom surface 107b and the side surface 107s.

Figure 7:
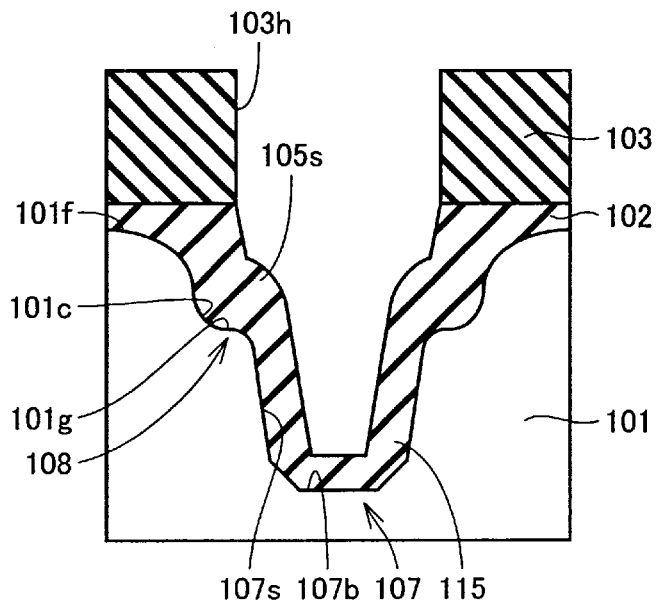

Referring to FIG. 7, the surface of the trench 107 is thermally oxidized in order to remove a damage layer resulting from plasma etching for forming the trench 107 and to round a portion, forming a corner of the trench 107, continuous to the main surface 101f and the intermediate surface 101c thereby preventing field concentration. Thus, a thermal oxide film 115 of about 30 nm in thickness is formed. On the intermediate surface 101c, it follows that a thermal oxide film of about 130 nm in thickness is formed along with the step shown in FIG. 4.

Figure 8:
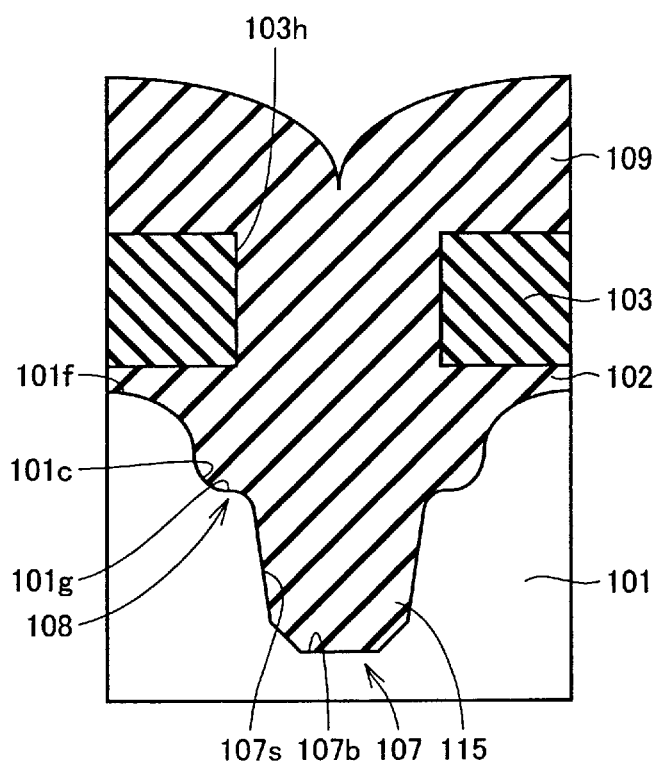

Referring to FIG. 8, the silicon oxide film 109 is embedded in the trench 107. The thickness of the silicon oxide film 109 is about 500 nm.

Figure 9:
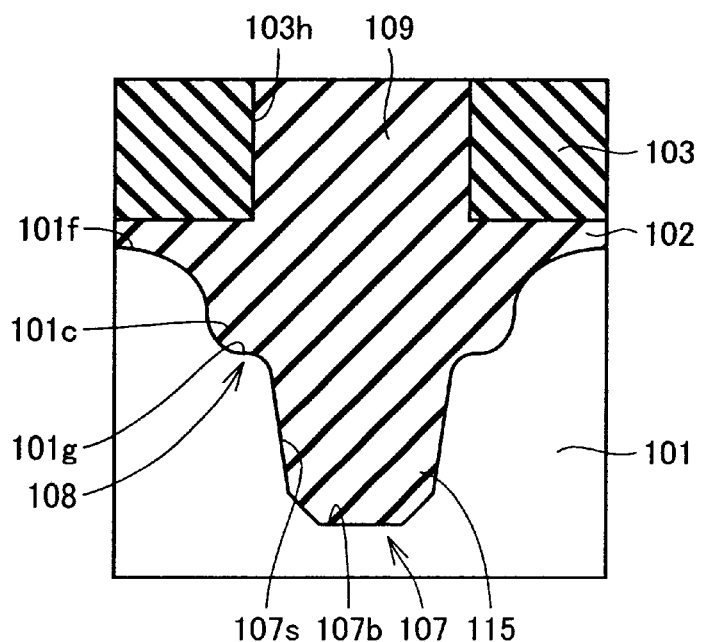

Referring to FIG. 9, the silicon oxide film 109 is partially removed to expose the surface of the silicon nitride film 103. The silicon oxide film 109 is partially removed by CMP or an etch-back method.

Figure 10:
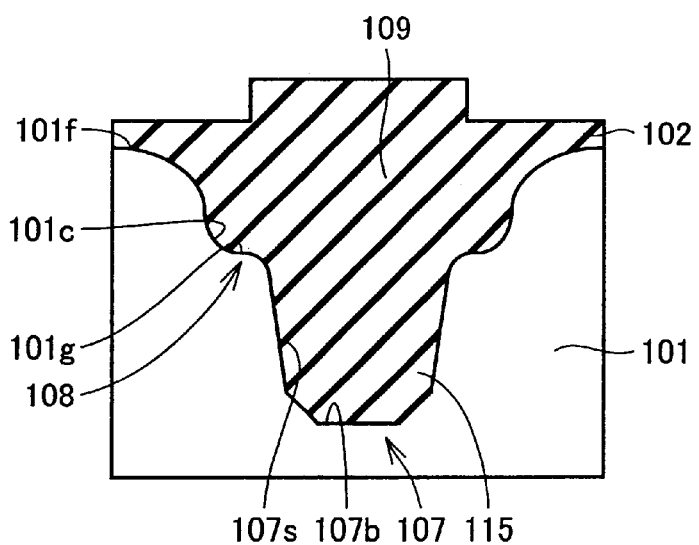

Referring to FIG. 10, the silicon oxide film 109 is wet-etched with hydrofluoric acid by a prescribed amount. Thereafter the silicon nitride film 103 is removed with hot phosphoric acid. Thus, trench isolation is completed.

Referring to FIG. 2, n-type impurity ions are implanted into the silicon substrate 101, thereby forming the n-type impurity regions 121. The interlayer isolation film 120 is formed on the silicon oxide film 109. A resist pattern is formed on the interlayer isolation film 120 for etching the interlayer isolation film 120 along the resist pattern. Thus, the contact hole 120h is formed. The n-type impurity is SAC-injected into the silicon substrate 101 through the contact hole 120h, and thereafter the plug layer 123 is formed to fill up the contact hole 120h. Thus, the semiconductor device 100 shown in FIG. 2 is completed.

In the semiconductor device 100 having the aforementioned structure, the plug layer 123 filling up the contact hole 120h comes into contact with only the n-type impurity region 121, not in contact with the p-type impurity. Therefore, generation of a leakage current can be prevented for providing a semiconductor device 100 having high reliability.

According to the aforementioned fabrication method, the intermediate surface 101c of the trench 107 is oxidized twice through the steps shown in FIGS. 4 and 7. Therefore, this portion can be so sufficiently rounded that field concentration can be relaxed in this portion. Further, the remaining surface of the trench 107 is oxidized only once. Consequently, the trench 107 is not reduced in width, whereby the silicon oxide film 109 can readily fill up the trench 107.

(Second Embodiment)

Figure 11:
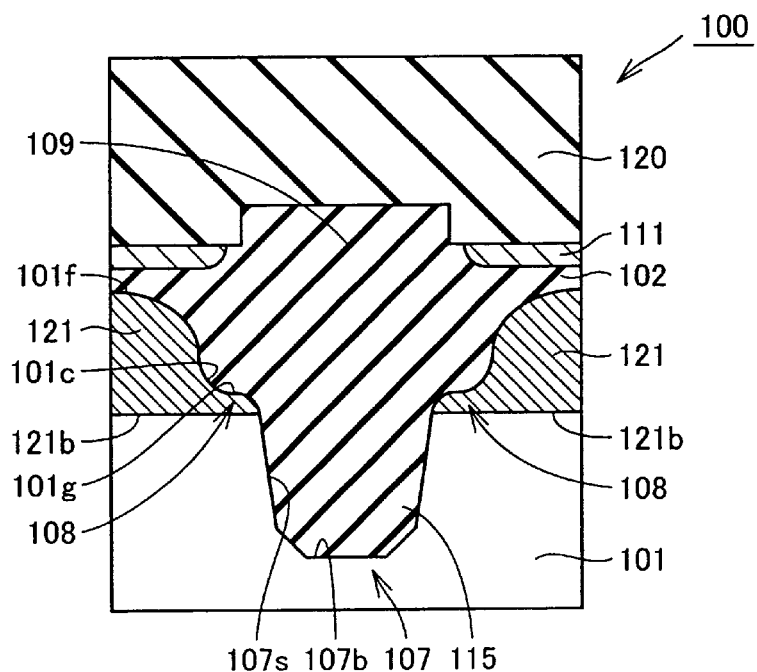
FIG. 11 is a sectional view of a semiconductor device according to a second embodiment of the present invention.

FIG. 11 is a sectional view of a semiconductor device 100 according to a second embodiment of the present invention. Referring to FIG. 11, the semiconductor device 100 according to the second embodiment of the present invention is different from the semiconductor device 100 according to the first embodiment in a point that the same has a doped polysilicon film 111 serving as a polysilicon layer formed on a thermal oxide film 102. The doped polysilicon film 111 may be replaced with a polysilicon film.

Figure 12:
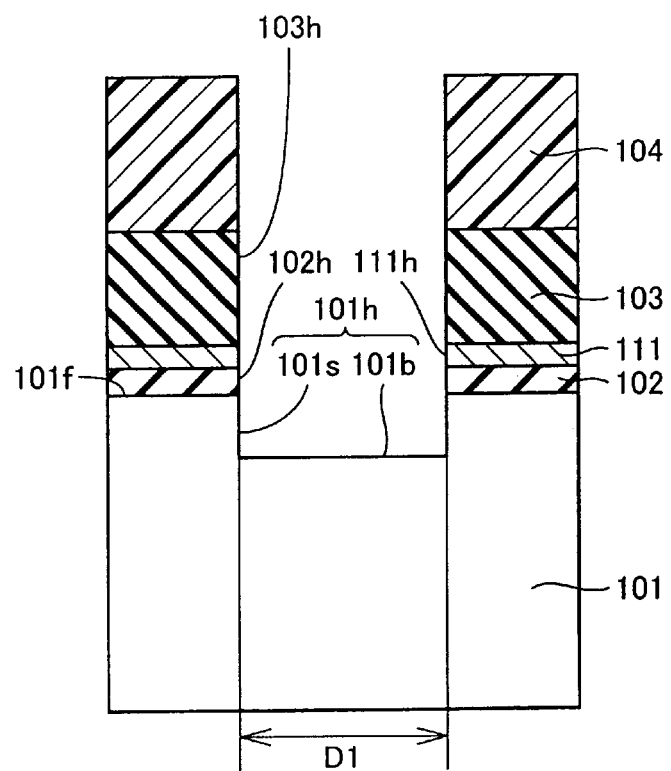
FIGS. 12 to 19 are sectional views showing first to eighth steps of a method of fabricating a semiconductor device according to the second embodiment of the present invention.

FIGS. 12 to 19 are sectional views for illustrating a method of fabricating a semiconductor device according to the second embodiment of the present invention. Referring to FIG. 12, the thermal oxide film 102 is formed on a main surface 101f of a silicon substrate 101. The doped polysilicon film 111 is formed on the thermal oxide film 102 as the polysilicon layer. A silicon nitride film 103 and a resist pattern 104 are formed on the doped polysilicon film 111. The resist pattern 104 is employed as a mask for etching the silicon nitride film 103, the doped polysilicon film 111, the thermal oxide film 102 and the silicon substrate 101. Thus, openings 103h and 102h and a cavity 101h are formed similarly to the first embodiment while forming an opening 111h in the doped polysilicon film 111 as a second opening. The cavity 101h has a relatively large opening diameter D1.

Figure 13:
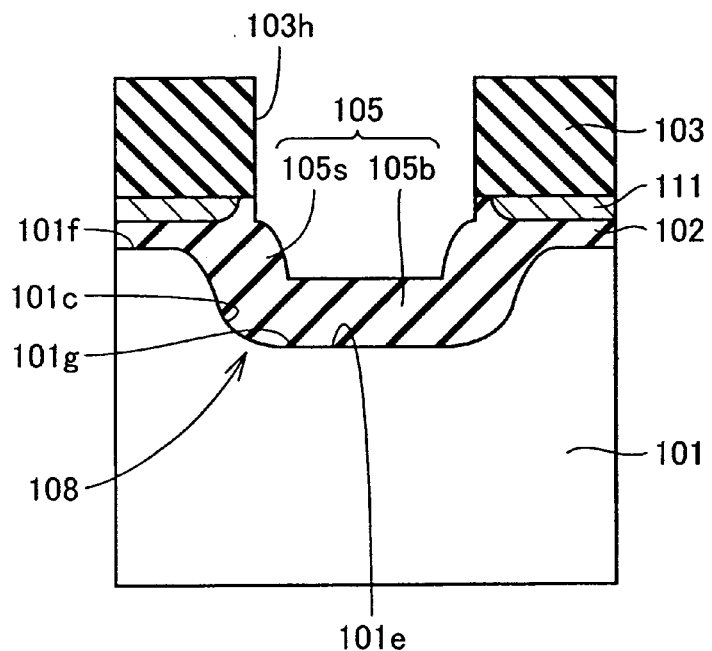

Referring to FIG. 13, the resist pattern 104 is removed for thereafter thermally oxidizing a side surface 101s and a bottom surface 101b of the cavity 101h and a portion of the doped polysilicon film 111 defining the opening 111h. Thus, a thermal oxide film 105 is formed as a second silicon oxide film. The thermal oxide film 105 has a side portion 105s resulting from oxidation of the side surface 101s and the doped polysilicon film 111 and a bottom portion 105b resulting from oxidation of the bottom surface 101b. At the same time, a cavity 108 is formed in the silicon substrate 101 as a second cavity. The cavity 108 includes an intermediate surface 101c having a portion 101g parallel to the main surface 101f. The surface of the cavity 108 is rounded.

Figure 14:
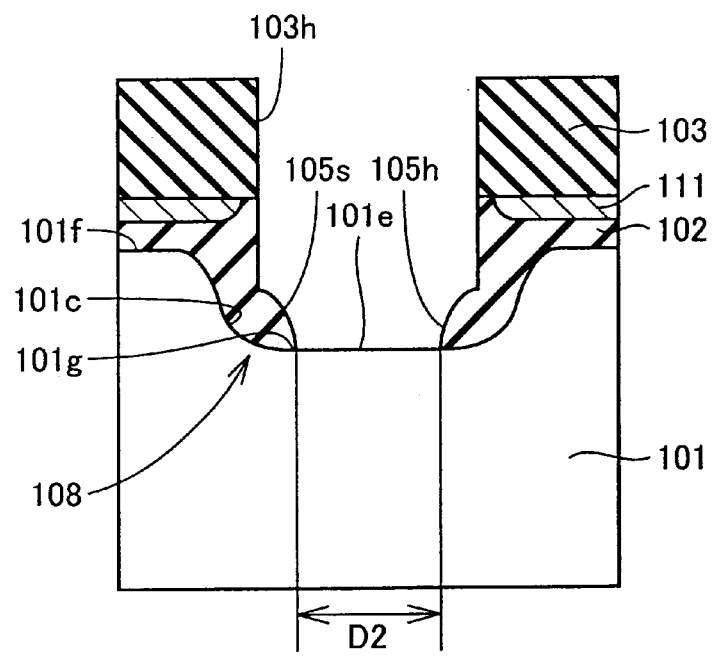

Referring to FIG. 14, the thermal oxide film 105 is etched along the opening 103h. Thus, the bottom portion 105b of the thermal oxide film 105 is removed while leaving the side portion 105s. At the same time, a surface 101e of the silicon substrate 101 defining the bottom surface of the cavity 108 is exposed. The side portion 105s defines a fourth opening 105h. The fourth opening 105h has an opening diameter D2 smaller than the first opening diameter D1.

Figure 15:
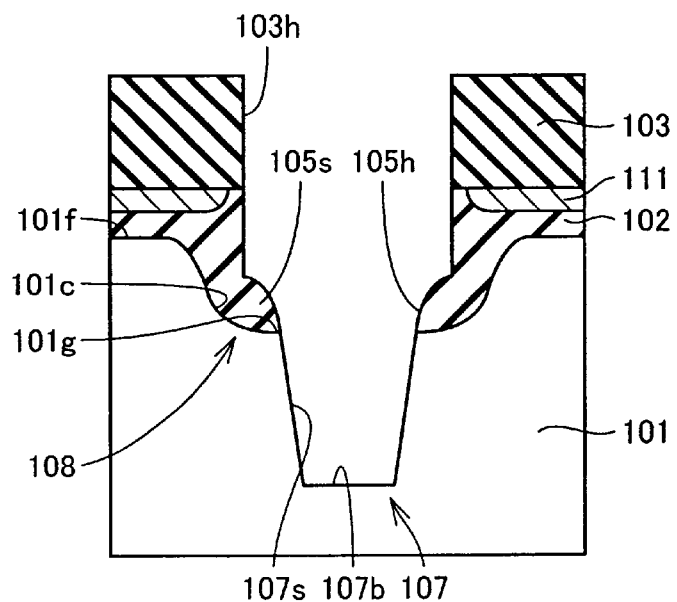

Referring to FIG. 15, the silicon substrate 101 is continuously etched along the opening 105h, thereby forming a trench 107.

Figure 16:
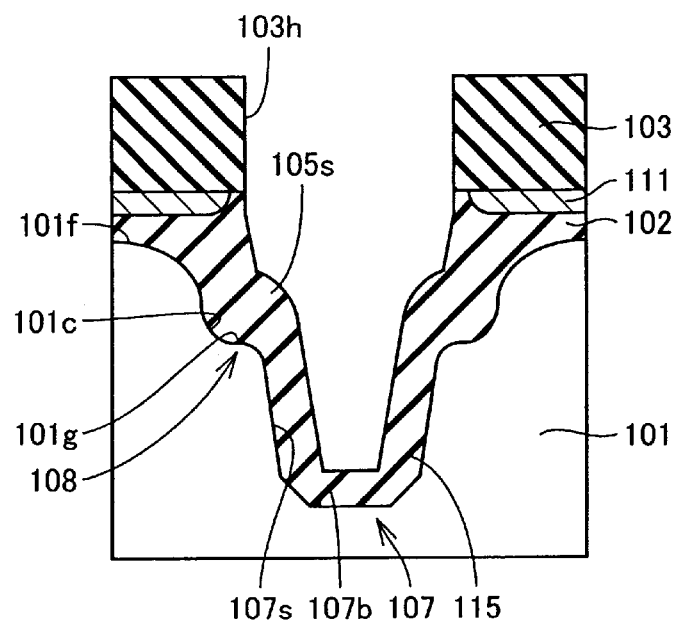

Referring to FIG. 16, the surface of the trench 107 is thermally oxidized thereby forming a thermal oxide film 115. The intermediate surface 101c of the trench 107 is also oxidized at this time, and hence the thickness of the thermal oxide film 115 is particularly increased on the portion of the intermediate surface 101c. In the remaining portion, however, thermal oxidation is performed only once.

Figure 17:
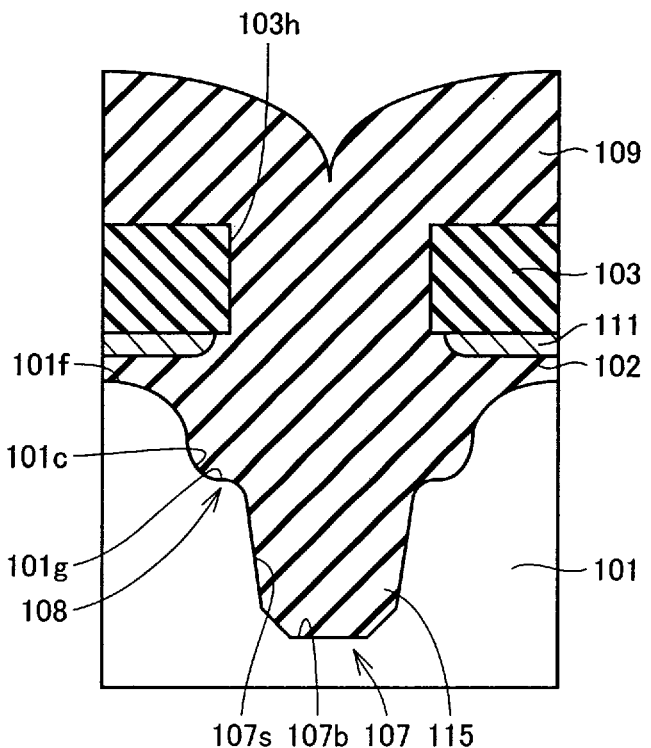

Referring to FIG. 17, a silicon oxide film 109 is embedded in the trench 107. The thickness of the silicon oxide film 109 is about 500 nm.

Figure 18:
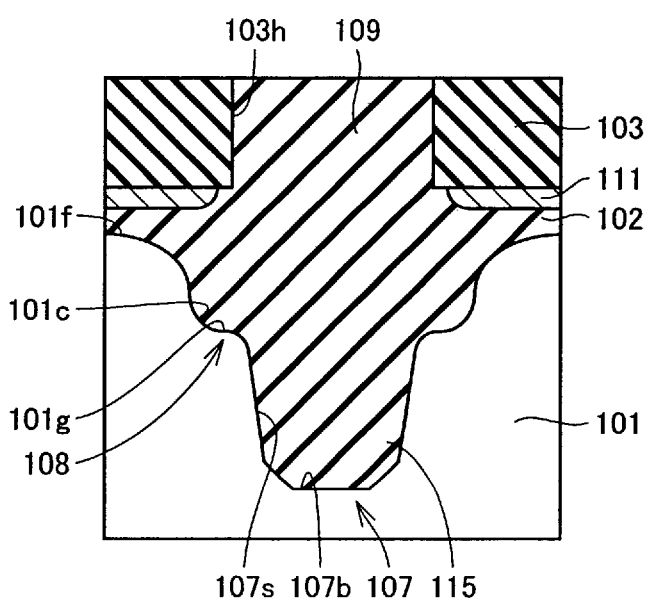

Referring to FIG. 18, the silicon oxide film 109 is partially removed to expose the surface of the silicon nitride film 103. The silicon oxide film 109 is partially removed by CMP or an etch-back method.

Figure 19:
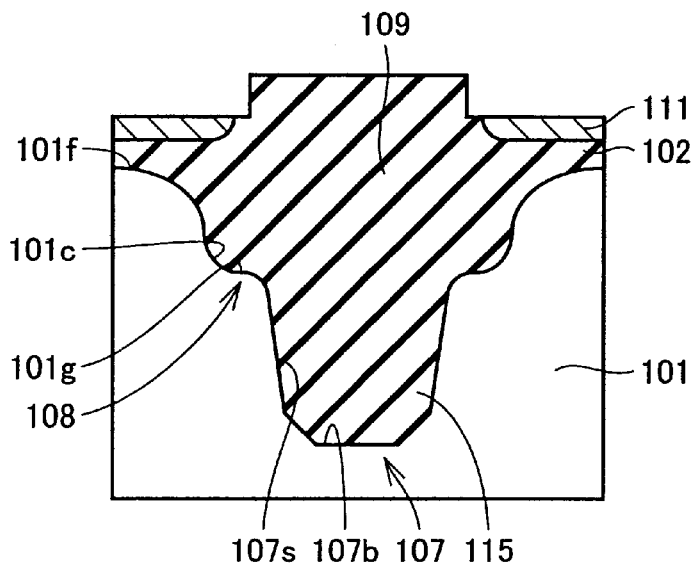

Referring to FIG. 19, the silicon oxide film 109 is wet-etched with hydrofluoric acid by a prescribed amount. Thereafter the silicon nitride film 103 is removed with hot phosphoric acid. Thereafter an interlayer isolation film 120 is formed similarly to the first embodiment, thereby completing the semiconductor device 100 shown in FIG. 11.

The aforementioned semiconductor device 100 has an effect similar to that of the semiconductor device 100 according to the first embodiment. Further, the portion of the doped polysilicon film 111 defining the opening 111h is also oxidized, whereby the thickness of the thermal oxide film 115 is particularly increased on the intermediate surface 101c of the trench 107. Consequently, field concentration can be relaxed on the intermediate surface 101c, i.e., a corner of the trench 107, beyond the first embodiment.

(Third Embodiment)

According to a third embodiment of the present invention, a nonvolatile semiconductor memory device is fabricated as a semiconductor device.

First, a strip-shaped conductor film is employed as a doped polysilicon film 111 similar to that according to the second embodiment shown in FIG. 19. A dielectric film consisting of a silicon oxide film, a silicon nitride film and a silicon oxide film and a doped polysilicon film for defining a control gate electrode are formed on the strip-shaped conductor film.

Figure 20:
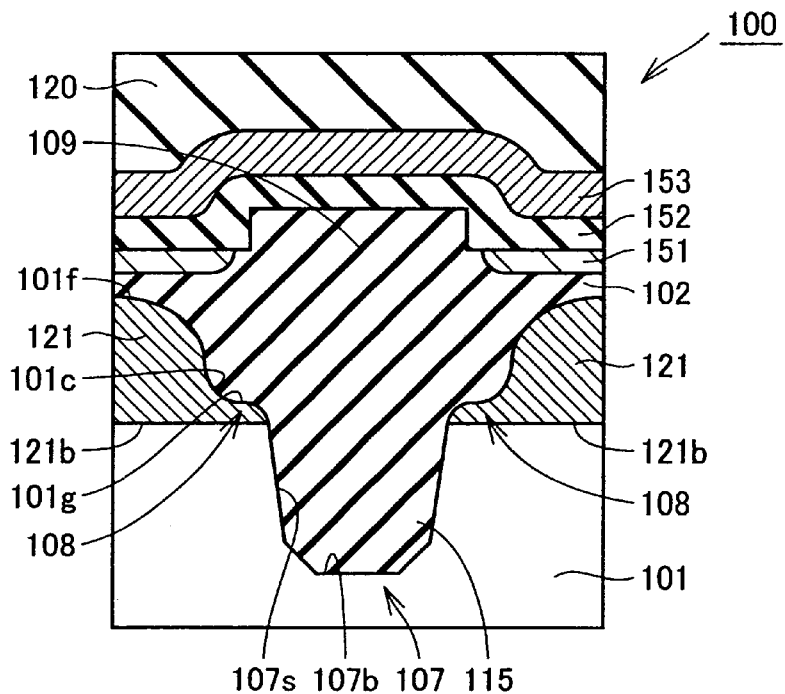
FIG. 20 is a sectional view of a nonvolatile semiconductor memory device according to a third embodiment of the present invention.
Figure 21:
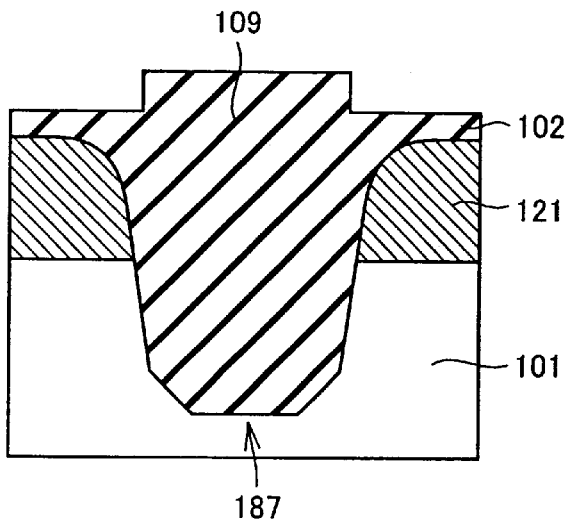
FIG. 21 is a sectional view of a conventional semiconductor device.
Figure 22:
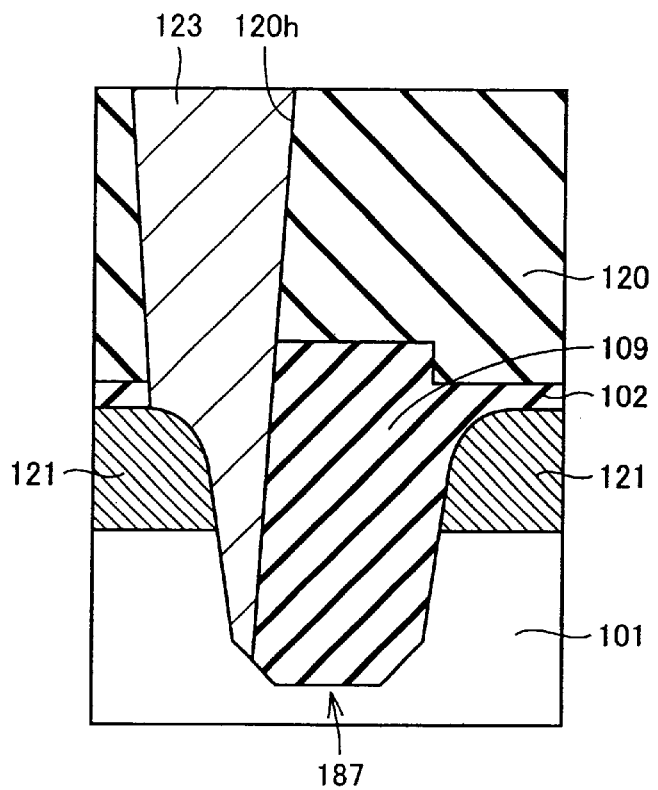
FIG. 22 is a sectional view showing a problem caused in the conventional semiconductor device.

A resist pattern having the pattern of the control gate electrode is formed on the doped polysilicon film, for etching the doped polysilicon film, the dielectric film and the strip-shaped conductor film along the resist pattern. Thus, a semiconductor device 100 is obtained as a nonvolatile semiconductor memory device having a floating gate electrode 151, a dielectric film 152 and a control gate electrode 153 as shown in FIG. 20. The floating gate electrode 151 is obtained by etching the doped polysilicon film 111 formed by the strip-shaped conductor film.

The semiconductor device 100 according to the third embodiment fabricated through the aforementioned steps has an effect similar to that of the semiconductor device 100 according to the second embodiment. Further, etching can be performed for forming a trench 107 subsequently to the step of forming the strip-shaped conductor film for defining the floating gate electrode 151, whereby the nonvolatile semiconductor memory device can be provided without increasing the number of fabrication steps.

While the embodiments of the present invention have been described, the embodiments described above can be modified in various ways. The inventive semiconductor device having trench isolation can be applied to a region of a DRAM (dynamic random access memory) or an SRAM (static random access memory) isolating memory elements from each other. The present invention is also applicable to element isolation in a logic region.

Although the present invention has been described and illustrated in detail, it is clearly understood that the same is by way of illustration and example only and is not to be taken by way of limitation, the spirit and scope of the present invention being limited only by the terms of the appended claims.

According to the present invention, elements can be reliably isolated from each other through a trench, for providing a highly reliable semiconductor device having a small leakage current.

According to the present invention, the intermediate surface preferably has a stepped shape. The intermediate surface has a portion substantially parallel to the main surface. A portion of the semiconductor substrate defining the side surface and the bottom surface contains a first conductivity type impurity, and the impurity region contains a second conductivity type impurity. The semiconductor device further comprises an insulating layer filling up the trench. The semiconductor device further comprises a gate insulator film formed on the main surface and a gate electrode formed on the gate insulator film. The semiconductor device further comprises an interlayer isolation film formed on the main surface to have a contact hole reaching the impurity region and a conductive layer filling up the contact hole to be electrically connected to the impurity region. The step of forming the polysilicon layer includes a step of forming a strip-shaped conductive layer for defining a floating gate electrode, and the method of fabricating a semiconductor device further comprises a step of patterning the strip-shaped conductive layer after forming the trench thereby forming the floating gate electrode.

What is claimed is:

1. A semiconductor device comprising:
    a semiconductor substrate having a main surface and including a trench formed on said main surface, wherein
        said trench is defined by surfaces including a bottom surface, a side surface, continuous to said bottom surface, having first inclination with respect to said main surface, an intermediate surface, formed between said main surface and said bottom surface, having second inclination smaller than said first inclination with respect to said main surface, and a surface of a portion of said main surface connected to said intermediate surface,
    said semiconductor device further comprising an impurity region including a bottom surface having a depth from said main surface larger than the depth from said main surface to said intermediate surface, said impurity region extending to cover from said main surface to said intermediate surface, and
    an insulation layer extending from said portion of said main surface to said bottom surface of said trench to fill said trench, wherein
        said side and bottom surfaces of said trench are defined by a portion of said semiconductor substrate containing an impurity of a first conduction type and also contracting said impurity region, and
        said impurity region contains an impurity of a second conduction type.

2. The semiconductor device according to claim 1, wherein said intermediate surface has a stepped shape.

3. The semiconductor device according to claim 2, wherein said intermediate surface has a portion substantially parallel to said main surface.

4. The semiconductor device according to claim 2, wherein a portion of said semiconductor substrate located in a vicinity of said intermediate surface is oxidized a larger number of times than a portion of said semiconductor substrate located between said side and bottom surfaces of said trench.

5. The semiconductor device according to claim 1, further comprising a gate insulator film formed on said main surface, a floating gate electrode formed on said gate insulator film, a dielectric film covering said floating gate electrode and said insulation layer, and a control gate electrode covering said dielectric layer.

6. The semiconductor device according to claim 1, further comprising an interlayer isolation film formed on said main surface to have a contact hole reaching said impurity region and a conductive layer filling up said contact hole to be electrically connected to said impurity region, and also contacting said intermediate surface.

7. A method of fabricating a semiconductor device, comprising steps of:

forming a first silicon oxide film on a main surface of a semiconductor substrate;

forming a polysilicon layer on said first silicon oxide film;

forming a mask layer including a first opening having a first opening diameter on said polysilicon layer;

selectively removing part of said polysilicon layer, part of said first silicon oxide film and part of said semiconductor substrate along said first opening through said mask layer serving as a mask thereby forming a second opening continuous to said first opening in said polysilicon layer, forming a third opening continuous to said second opening in said first silicon oxide film and forming a first cavity, defined by a side surface and a bottom surface, continuous to said third opening in said semiconductor substrate;

oxidizing the portion of said polysilicon layer defining said second opening and said side and bottom surfaces of said first cavity for forming a second silicon oxide film having a side portion and a bottom portion while forming a second cavity receiving said second silicon oxide film in said semiconductor substrate;

removing said bottom portion of said second silicon oxide film for exposing the bottom surface of said second cavity while leaving said side portion of said second silicon oxide film thereby forming a fourth opening, defined by said side portion, having an opening diameter smaller than said first opening diameter;

selectively removing part of said semiconductor substrate along said fourth opening through said side portion serving as a mask thereby forming a trench; and oxidizing the surface of said trench.

8. The method of fabricating a semiconductor device according to claim 7, wherein said step of forming said polysilicon layer includes a step of forming a strip-shaped conductive layer for defining a floating gate electrode, said method further comprising a step of patterning said strip shaped conductive layer after forming said trench for forming said floating gate electrode.

* * * * *